(12) United States Patent
Johnson et al.

(10) Patent No.: US 11,323,105 B2
(45) Date of Patent: May 3, 2022

(54) METHOD AND SYSTEM FOR ARBITRARY OPTICAL PULSE GENERATION

(71) Applicant: Fermi Research Alliance, LLC, Batavia, IL (US)

(72) Inventors: David Johnson, Geneva, IL (US); Todd Johnson, Aurora, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 475 days.

(21) Appl. No.: 16/440,573

(22) Filed: Jun. 13, 2019

(65) Prior Publication Data

US 2019/0386647 A1    Dec. 19, 2019

Related U.S. Application Data

(60) Provisional application No. 62/685,748, filed on Jun. 15, 2018.

(51) Int. Cl.
| | | |
|---|---|---|
| *H03K 5/02* | (2006.01) | |
| *H01S 5/062* | (2006.01) | |
| *H03K 5/00* | (2006.01) | |
| *H04B 10/508* | (2013.01) | |
| *H04B 10/524* | (2013.01) | |
| *H03K 3/014* | (2006.01) | |

(52) U.S. Cl.
CPC .......... *H03K 5/02* (2013.01); *H01S 5/06216* (2013.01); *H03K 3/014* (2013.01); *H03K 2005/00286* (2013.01); *H04B 10/508* (2013.01); *H04B 10/524* (2013.01)

(58) Field of Classification Search
None
See application file for complete search history.

(56) References Cited

U.S. PATENT DOCUMENTS

| | | |
|---|---|---|
| 3,729,690 A | 4/1973 | Snitzer |
| 4,546,476 A | 10/1985 | Shaw |
| 4,815,079 A | 3/1989 | Snitzer |
| 5,050,949 A | 9/1991 | DiGiovanni |
| 5,138,483 A | 8/1992 | Grasso |
| 5,140,456 A | 8/1992 | Huber |
| 5,218,608 A | 6/1993 | Aoki |
| 5,297,154 A | 3/1994 | Heidemann |
| 5,400,350 A | 3/1995 | Galvanauskas |
| 5,430,572 A | 7/1995 | DiGiovanni |
| 5,485,480 A | 1/1996 | Kleinerman |
| 5,696,782 A | 12/1997 | Harter |
| 5,933,271 A | 8/1999 | Waarts |
| 6,288,835 B1 | 9/2001 | Nilsson |
| 7,633,992 B1 * | 12/2009 | Miao ................... H01S 5/02251 372/102 |
| 9,146,088 B1 * | 9/2015 | Filsinger ............... F42B 12/204 |

(Continued)

*Primary Examiner* — Darren E Wolf
(74) *Attorney, Agent, or Firm* — Loza & Loza LLP; Kevin L. Soules

(57) ABSTRACT

A system, method, and apparatus for continuous seed laser pulses supplied to a CW pumped pre-amplifier and/or power-amplifier chain comprises an optical modulator configured to impress pulse signals on an optical signal, a waveform generator configured to establish a structure of the optical signal, and a keep-alive circuit that generates a continuous electrical pulse pattern provided to the optical modulator, wherein the system provides a continuous seed laser pulse structure.

18 Claims, 9 Drawing Sheets

(56) References Cited

U.S. PATENT DOCUMENTS

| | | | |
|---|---|---|---|
| 2003/0175037 A1* | 9/2003 | Kimmitt | G02F 1/0123 |
| | | | 398/198 |
| 2005/0013008 A1* | 1/2005 | Duboc | G03B 21/2053 |
| | | | 359/634 |
| 2005/0014499 A1* | 1/2005 | Knoblach | B64C 19/00 |
| | | | 455/431 |
| 2006/0204248 A1* | 9/2006 | Grigoryan | H04B 10/299 |
| | | | 398/161 |
| 2008/0316918 A1* | 12/2008 | Sakauchi | H04L 12/437 |
| | | | 370/223 |
| 2009/0214215 A1* | 8/2009 | Li | H04J 14/02 |
| | | | 398/81 |
| 2017/0189640 A1* | 7/2017 | Sadwick | H05B 47/12 |
| 2019/0196924 A1* | 6/2019 | Gregg | G06F 13/4068 |

* cited by examiner

METHOD AND SYSTEM FOR ARBITRARY OPTICAL PULSE GENERATION

CROSS REFERENCE TO RELATED PATENT APPLICATIONS

The present application claims the priority and benefit under 35 U.S.C. § 119(e) of U.S. Provisional Patent Application Ser. No. 62/685,748 filed Jun. 15, 2018, entitled "METHOD AND SYSTEM FOR ARBITRARY OPTICAL PULSE GENERATION." U.S. Provisional Patent Application Ser. No. 62/685,748 is herein incorporated by reference in its entirety.

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of amplifiers. Embodiments are further related to the field of fiber amplifiers. Embodiments are further related to the field of optical amplifiers. Embodiments are also related to methods, systems, and devices for pump power supplied to amplifiers. Embodiments are further related to methods, systems, and devices for continuous seed laser pulses supplied to a CW pumped pre-amplifier and/or power-amplifier chain.

BACKGROUND

Amplifiers are a critical component of many electrical systems. Fiber amplifiers are a special type of optical amplifier that uses optical fiber as the gain medium. In some common examples, the gain medium can be doped glass fiber.

Fiber amplifiers are used in a number of applications. For example, in some cases, amplifiers are necessary in communication applications where signals need to be amplified because they travel a long distance. In other examples, fiber amplifiers can be used for high power application where power output, from hundreds of watts to thousands of watts, may be required. One such exemplary application is laser material processing.

While fiber amplifiers are useful, they also have certain limitations. Gain fiber needs to be pulsed when a laser output is desired. However, such pulsing can result in an output with a non-uniform amplitude. Further, when amps are pumped with high power, they need a continuous seed source or there is a possibility of failure. As such, on demand applications require a continuously pumped amplification system.

Accordingly, there is a need in the art for systems and methods that provide continuous seed laser pulses supplied to a CW pumped amplifier as further detailed in the embodiments disclosed herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method, system, and apparatus for amplification.

It is another aspect of the disclosed embodiments to provide a method, system, and apparatus for providing fiber-based amplifier applications.

It is another aspect of the disclosed embodiments to provide methods, systems, and devices for pump power supplied to amplifiers.

It is yet another aspect of the disclosed embodiments to provide methods, systems, and devices for continuous seed laser pulses supplied to a CW pumped pre-amplifier and/or power-amplifier chain.

It is another aspect of the disclosed embodiments to provide a seed laser with a CW output and a Mach-Zehnder modulator (MZM) that creates a pulse train with a keep-alive circuit or arbitrary waveform generator (AWG) which can be input into the CW pumped fiber amplifier.

In the embodiments disclosed herein a system for supplying continuous seed laser pulses can comprise an optical modulator configured to impress pulse signals on an optical signal, a waveform generator configured to establish a structure of the optical signal, and a keep-alive circuit that generates a continuous electrical pulse pattern provided to the optical modulator wherein the system provides a continuous seed laser pulse structure. The system can include a synchronization circuit configured to synchronize the optical pulses to an external process. The system can further comprise a single frequency laser diode, wherein the single frequency laser diode outputs the optical signal.

In certain embodiment the system can comprise a computer system configured to implement non-transitory instruction media for controlling the waveform generator, generating a desired waveform. The waveform generator further generates a marker pulse provided to the keep-alive circuit.

In an embodiment the keep-alive circuit further comprises a crystal oscillator, a count-down and 1-shot circuit, a delay circuit configured to generate keep-alive pulses, and a driver circuit configured to generate at least one trigger.

In an embodiment the system further comprises a process trigger that synchronizes an output the system to a process. The system can provide a continuous seed laser pulse structure to an amplifier.

In an embodiment a pulse generation apparatus comprises a seed laser producing an optical signal, an optical modulator configured to impress pulse signals on the optical signal, a waveform generator configured to establish a structure of the optical signal, and a keep-alive circuit that generates a continuous electrical pulse pattern provided to the optical modulator wherein the system provides a continuous seed laser pulse structure. The pulse generation apparatus can further comprise a synchronization circuit configured to synchronize the optical pulses to an external process.

In certain embodiments, the seed laser further comprises a laser diode and an optical isolator.

In an embodiment the waveform generator further generates a marker pulse provided to the keep-alive circuit. In addition, in certain embodiments, the keep-alive circuit further comprises a crystal oscillator, a count-down and 1-shot circuit, a delay circuit configured to generate keep-alive pulses, and a driver circuit configured to generate at least one trigger. In certain embodiments the optical modulator comprises a Mach Zener Optical Modulator.

In an embodiment, the pulse generation apparatus further comprises a phase modulator and a radio frequency modulation module serves as an RF source for the phase modulator. The continuous seed laser pulse structure is provided to an amplifier.

In another embodiment, a method for pulse generation comprises producing an optical signal, imparting pulse signals on the optical signal with an optical modulator, structuring the optical signal with a waveform generator, generating a continuous electrical pulse pattern with a keep-alive circuit, the electrical pulse pattern being provided to the optical modulator, and providing a continuous seed laser pulse structure. In an embodiment the method for generation further comprises synchronizing the optical pulses to an external process with a synchronization circuit. In an embodiment the method for pulse generation further comprises generating a marker pulse and providing the marker pulse to the keep-alive circuit. The method for pulse generation can include providing the continuous seed laser pulse structure an amplifier.

BRIEF DESCRIPTION OF THE FIGURES

The accompanying figures, in which like reference numerals can refer to identical or functionally-similar elements throughout the separate views and which are incorporated in, and form a part of, the specification, further illustrate the embodiments and, together with the detailed description, serve to explain the embodiments disclosed herein.

DETAILED DESCRIPTION

Figure 1:
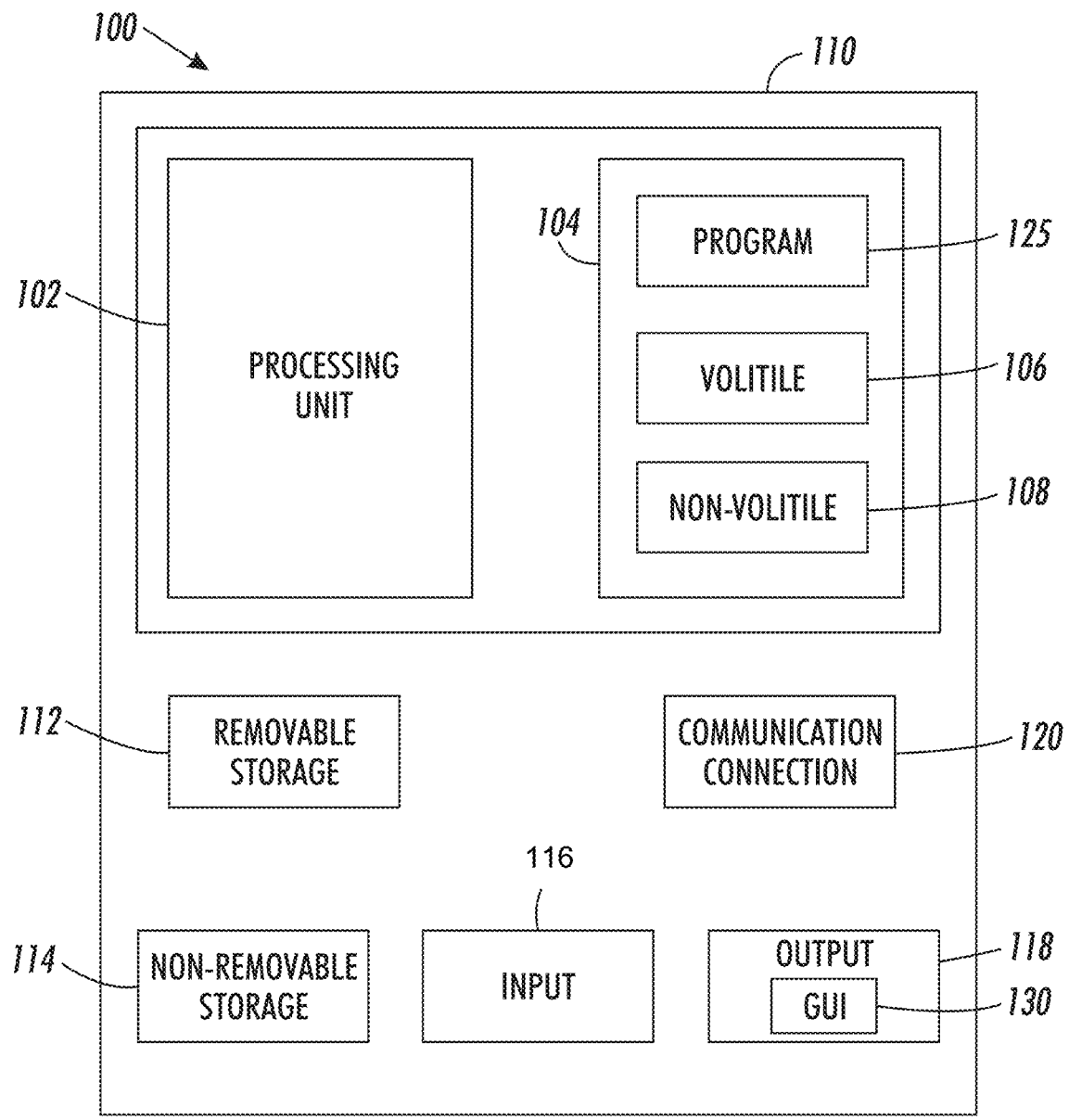
FIG. 1 depicts a block diagram of a computer system which is implemented in accordance with the disclosed embodiments.

The particular values and configurations discussed in the following non-limiting examples can be varied, and are cited merely to illustrate one or more embodiments and are not intended to limit the scope thereof.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers can refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing"

(and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Figure 2:
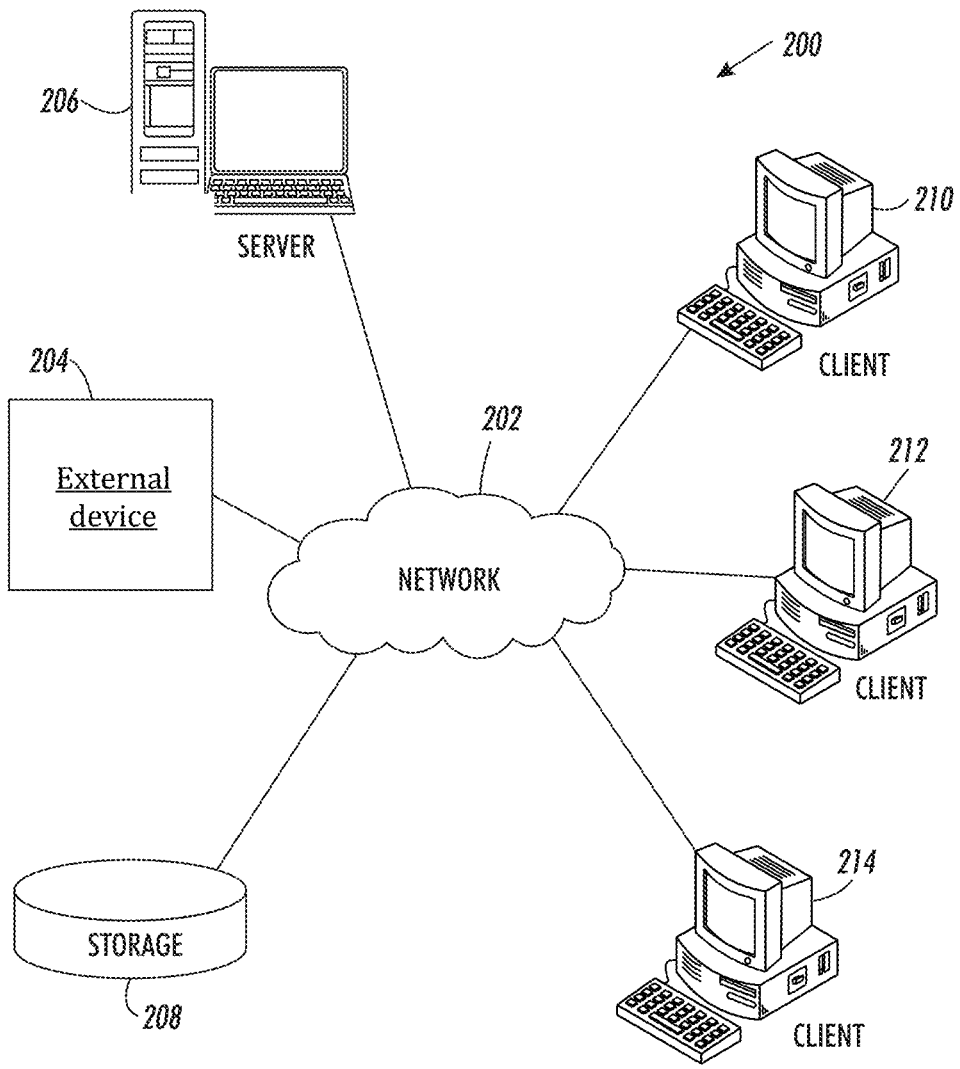
FIG. 2 depicts a graphical representation of a network of data-processing devices in which aspects of the present embodiments may be implemented.
Figure 3:
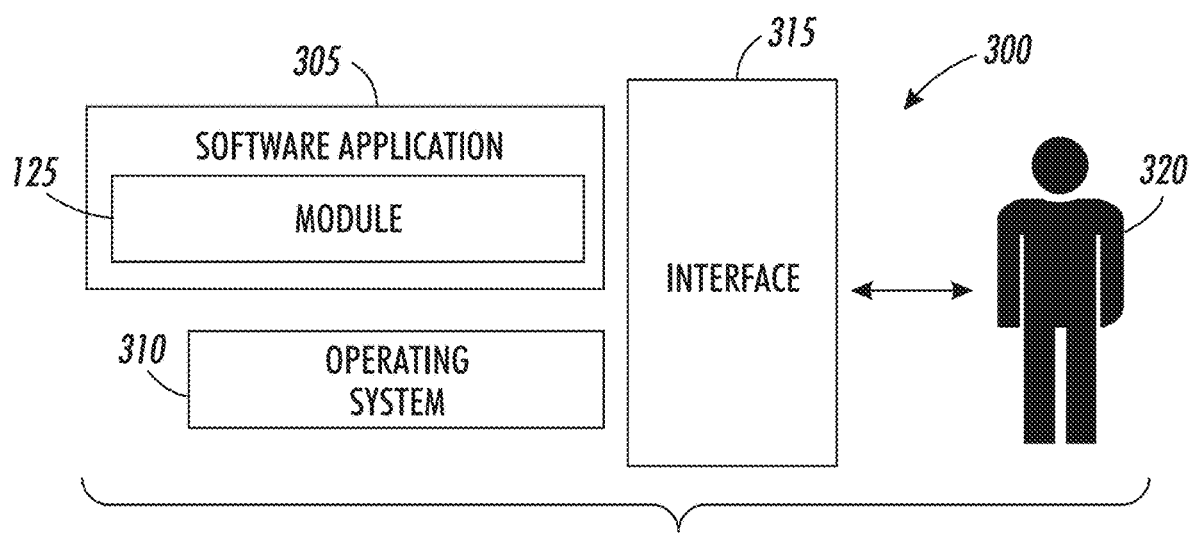
FIG. 3 illustrates a computer software system for directing the operation of the data-processing system depicted in FIG. 1, in accordance with an example embodiment.

FIGS. 1-3 are provided as exemplary diagrams of data-processing environments in which embodiments of the present invention may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing parts of the methods and systems disclosed herein is shown in FIG. 1. A computing device in the form of a computer 110 configured to interface with controllers, peripheral devices, and other elements disclosed herein may include one or more processing units 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data including image data.

Computer 110 may include, or have access to, a computing environment that includes input 116, output 118, and a communication connection 120. The computer may operate in a networked environment using a communication connection 120 to connect to one or more remote computers, remote sensors and/or controllers, detection devices, handheld devices, multi-function devices (MFDs), speakers, mobile devices, tablet devices, mobile phones, Smartphone, or other such devices. The remote computer may also include a personal computer (PC), server, router, network PC, RFID enabled device, a peer device or other common network node, or the like. The communication connection may include a Local Area Network (LAN), a Wide Area Network (WAN), Bluetooth connection, or other networks. This functionality is described more fully in the description associated with FIG. 2 below.

Output 118 is most commonly provided as a computer monitor, but may include any output device. Output 118 and/or input 116 may include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user, and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse, and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module or node 125, which can be representative of other modules or nodes described herein, are stored on a computer-readable medium and are executable by the processing unit 102 of computer 110. Program module or node 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 can be a network of computers or other such devices, such as mobile phones, smart phones, sensors, controllers, speakers, tactile devices, and the like, in which embodiments of the present invention may be implemented. Note that the system 200 can be implemented in the context of a software module such as program module 125. The system 200 includes a network 202 in communication with one or more clients 210, 212, and 214. Network 202 may also be in communication with one or more devices 204, servers 206, and storage 208. Network 202 is a medium that can be used to provide communications links between various devices and computers connected together within a networked data processing system such as computer system 100. Network 202 may include connections such as wired communication links, wireless communication links of various types, and fiber optic cables. Network 202 can communicate with one or more servers 206, one or more external devices such as device 204, and a memory storage unit such as, for example, memory or database 208. It should be understood that device 204 may be embodied as a circuit, detector device, controller, receiver, transmitter, transceiver, transducer, driver, signal generator, or other such device.

In the depicted example, device 204, server 206, and clients 210, 212, and 214 connect to network 202 along with storage unit 208. Clients 210, 212, and 214 may be, for example, personal computers or network computers, handheld devices, mobile devices, tablet devices, smart phones, personal digital assistants, printing devices, recording devices, speakers, MFDs, etc. Computer system 100 depicted in FIG. 1 can be, for example, a client such as client 210 and/or 212 and/or 214.

Computer system 100 can also be implemented as a server such as server 206, depending upon design considerations. In the depicted example, server 206 provides data such as boot files, operating system images, applications, and application updates to clients 210, 212, and/or 214. Clients 210, 212, and 214 and device 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet, with network 202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) or node(s) 125, may be "loaded" (i.e., transferred from removable storage 114 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that elements of the disclosed methods and systems may be practiced with other computer system configurations such as, for example, handheld devices, mobile phones, smart phones, tablet devices multi-processor systems, microcontrollers, printers, copiers, fax machines, multi-function devices, data networks, microprocessor-based or programmable consumer electronics, networked personal computers, minicomputers, mainframe computers, servers, medical equipment, medical devices, and the like.

Note that the term "module" or "node" as utilized herein may refer to a collection of routines and data structures that perform a particular task or implements a particular abstract data type. Modules may be composed of two parts: an interface, which lists the constants, data types, variables, and routines that can be accessed by other modules or routines; and an implementation, which is typically private (accessible only to that module) and which includes source code that actually implements the routines in the module. The term module may also simply refer to an application such as a computer program designed to assist in the performance of a specific task such as word processing, accounting, inventory management, etc., or a hardware component designed to equivalently assist in the performance of a task.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" system. It can be appreciated, of course, that other types of systems are possible. For example, rather than a traditional "windows" system, other operation systems such as, for example, a real-time operating system (RTOS) more commonly employed in wireless systems may also be employed with respect to operating system 310 and interface 315. The software application 305 can include, for example, module(s) 125, which can include instructions for carrying out steps or logical operations such as those shown and described herein.

The following description is presented with respect to embodiments of the present invention, which can be embodied in the context of, or require the use of, a data-processing system such as computer system 100, in conjunction with program module 125, and data-processing system 200 and network 202 depicted in FIGS. 1-3. The present invention, however, is not limited to any particular application or any particular environment. Instead, those skilled in the art will find that the system and method of the present invention may be advantageously applied to a variety of system and application software including database management systems, word processors, and the like. Moreover, the present invention may be embodied on a variety of different platforms including Windows, Macintosh, UNIX, LINUX, Android, Arduino and the like. Therefore, the descriptions of the exemplary embodiments, which follow, are for purposes of illustration and not considered a limitation.

In the embodiments disclosed herein, a pulse (e.g. an optical pulse pattern) generation system can generate arbitrary pulse patterns in burst mode of operation (BMO), or pulse on demand (POD) mode of operation. This system can provide a continuous seed laser pulse structure to an amplifier, such as a CW pumped pre- and power-amplifier chain, such that when a set of laser pulses are requested in either mode, the gain fiber is at optimal gain. "Pumping," as used in this context refers generally to energy transfer to a gain medium. The system can be synchronized to external processes and can generate triggers for pulse picking and laser diagnostics. It should be understood that the gain fiber can be co-pumped where the pump light and seed signal travel in the same direction, or it can be counter-pumped where the pump light and signal travel in opposite directions. The embodiments disclosed herein are not dependent on the direction of pump.

The system includes a "keep alive" circuit. The keep alive circuit is an electrical circuit whose output is sent to an electrical RF amplifier, whose output is input into a Mach Zener Optical Modulator (MZM) which modulates the CW seed source output automatically so that the amplifier does not fail while it waits for pulses of interest. When a pulse of interest is triggered the keep alive circuit automatically stops, and then restarts automatically after the pulse. This configuration allows the amplifier to operate properly so that it is ready at a high gain when a subsequent pulse is sent.

Figure 4A:
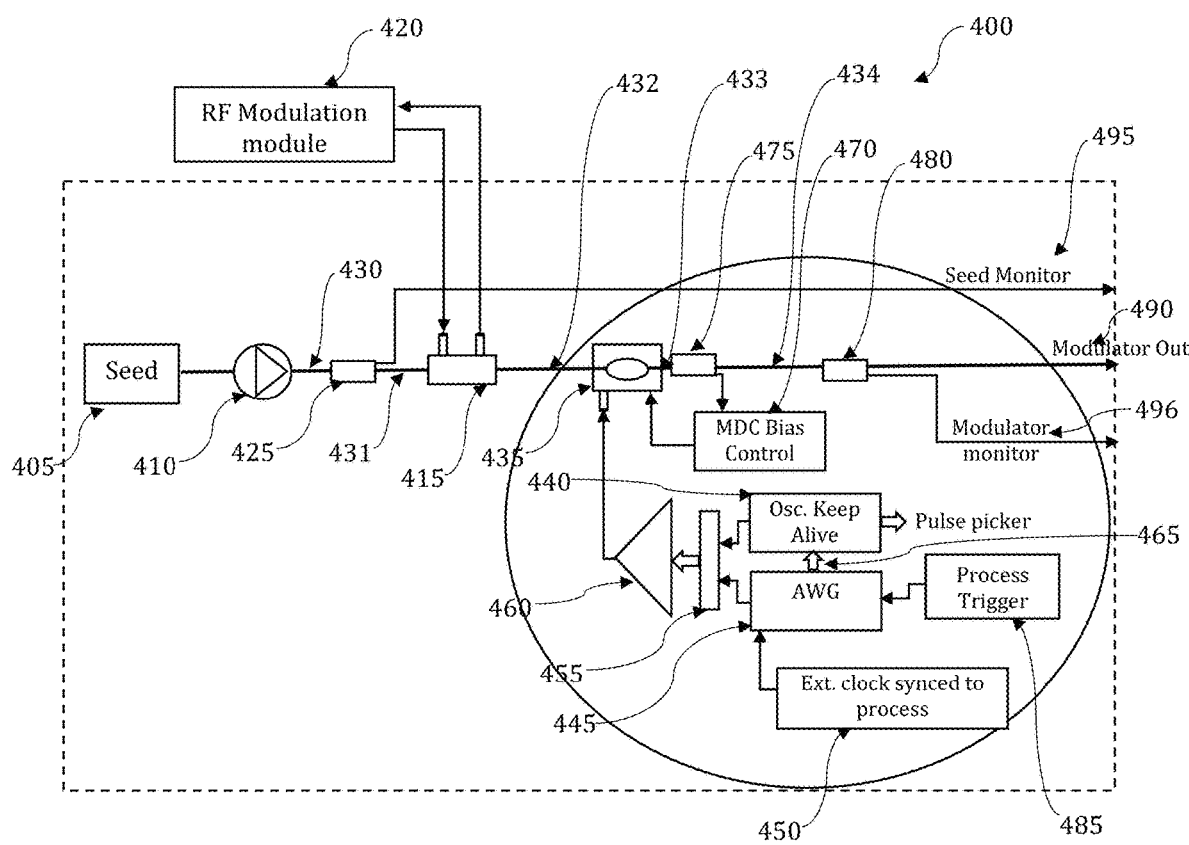
FIG. 4A depicts a block diagram of a system for arbitrary optical pulse generation, in accordance with the disclosed embodiments.

FIG. 4A illustrates system 400. The system 400 comprises a seed laser 405 that can serve as the initial laser source to be modulated, and optical isolator 410. The function of the optical isolator 410 is to prevent optical signals from propagating backward into the seed laser and causing instabilities, oscillations, or damage. Such backward signals could come from reflections or instabilities in downstream amplifiers. In certain embodiments the laser 405 and optical isolator 410 assembly can comprise a narrow frequency single mode CW laser diode that produces a beam 430.

Tap coupler 425 can be inserted in the beam path after the optical isolator 410. The tap coupler 425 can provide an output beam 431 to a seed monitor 495. The tap coupler 425 can remove only a small fraction of the beam. In an example embodiment, the tap coupler 425 can split the beam 430 at a ratio of 99:1, with the majority of the beam 431 progressing, and the minority of the beam being provided to the seed monitor 495. Other beam splitting ratios may alternatively be used.

The beam 431 can then be subject to a phase modulator 415, which can be embodied as an optical phase modulator. The phase modulator 415 can be connected to a radio frequency modulation module 420, which serves as an RF source. The phase modulator 415 and RF source associated with radio frequency modulation module 420 are used to create frequency side-bands for shifting the non-linear Stimulated Brillouin Scattering (SBS) threshold above the operating point of the final CW pumped power amplifier. Specific frequencies and amplitudes are adjustable, and dependent on the specific power amplifier parameters.

The beam 432 is then incident on an optical modulator 435 that can comprise an amplitude modulator such as a Mach Zener Optical Modulator (MZM). In general, Mach-Zehnder modulators configured to split an input into two beams. A phase shift is induced in one of the beams as it passes along one path by applying a voltage. When the two beams are recombined, the phase difference between the two beams can be used for amplitude modulation.

The MZM Modulator 435 can include automatic bias control provided by MDC bias control 470. The automatic MDC bias control 470 receives a signal from beam splitter 475, that can siphon a small ratio of the beam 433 exiting the MZM 435 (e.g. at a ratio of 95:5, or other such ratio). The automatic bias control 470 can be used to maximize the contrast in the output of the MZM 435 between the states when the RF input is on/off between RF pulses. This provides contrast in the amplitude modulated optical signal output 433 of the MZM 435.

The system 400 uses a keep-alive (KA) circuit 440 to generate a continuous electrical pulse pattern that is supplied to the optical modulator 435. The MZM 435 can encode the electrical pulse pattern on the output of the beam 433. The optical output (e.g. beam 434) of the MZM 435 is used for input to a CW pumped fiber amplifier system (or other such system that uses an amplifier).

A desired pattern of laser pulses for amplification can be written to an arbitrary waveform generator 445 (AWG) which can be triggered by an external synchronization circuit 450 which locks the generation of the electrical pulse signal to any desired process. For example, in certain embodiments, the synchronization circuit 450 can lock the generation of optical laser pulses to an ion beam pulse structure. In other embodiments, other processes can serve as the desired process for generating the electrical pulse signal.

Figure 4B:
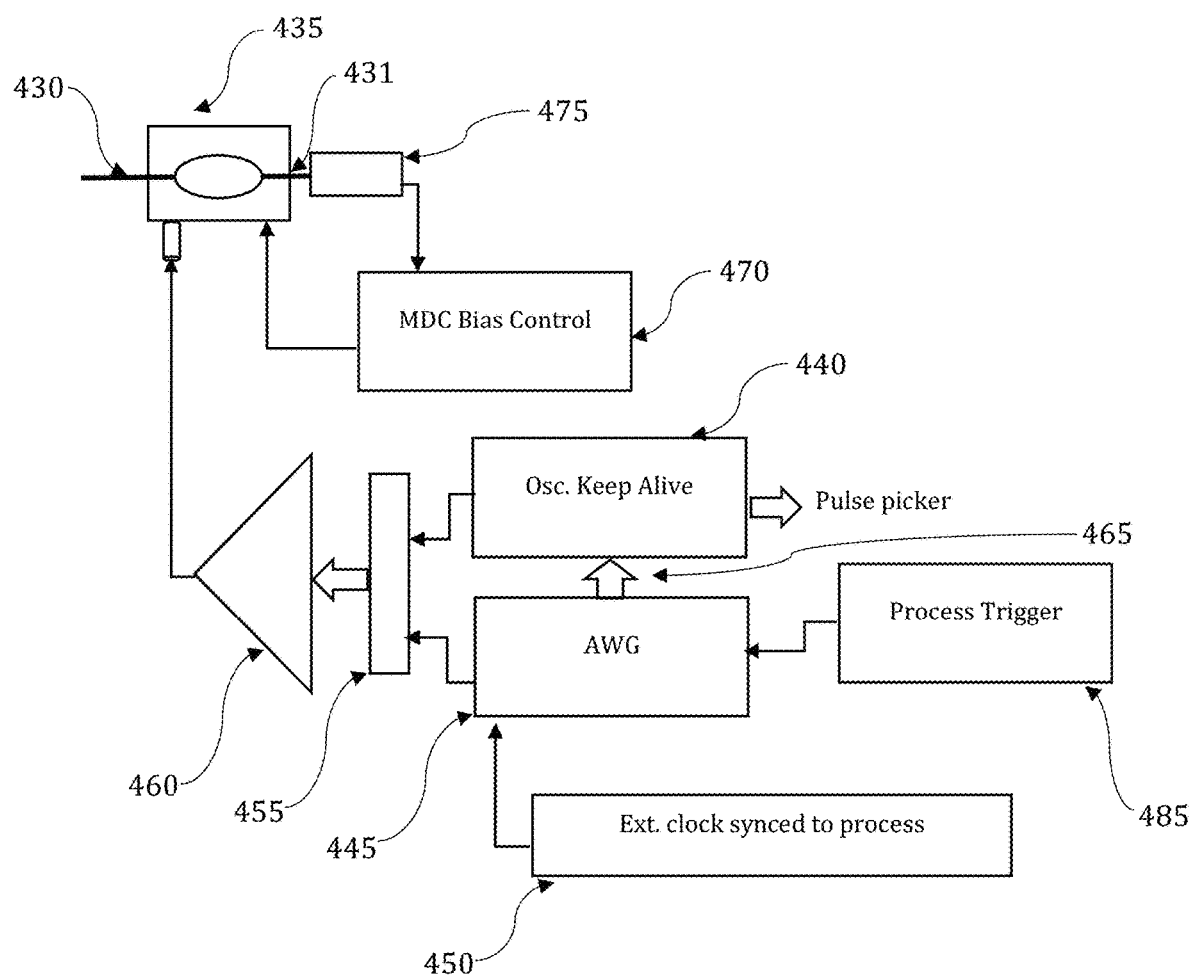
FIG. 4B depicts a detailed block diagram of a system for arbitrary optical pulse generation, in accordance with the disclosed embodiments.

The AWG 445 provides an electrical pulse pattern triggered by process trigger 485 which is summed at 455 with a KA electrical pulse pattern provided by the keep alive circuit 440. The process trigger 485 can comprise a trigger that synchronizes the output of the laser system to the process. The summed electrical pulse pattern is provided to an amplifier 460 and then used as input to the MZM 435. FIG. 4B illustrates an enlarged view of certain aspects of the system 400.

Figure 5:
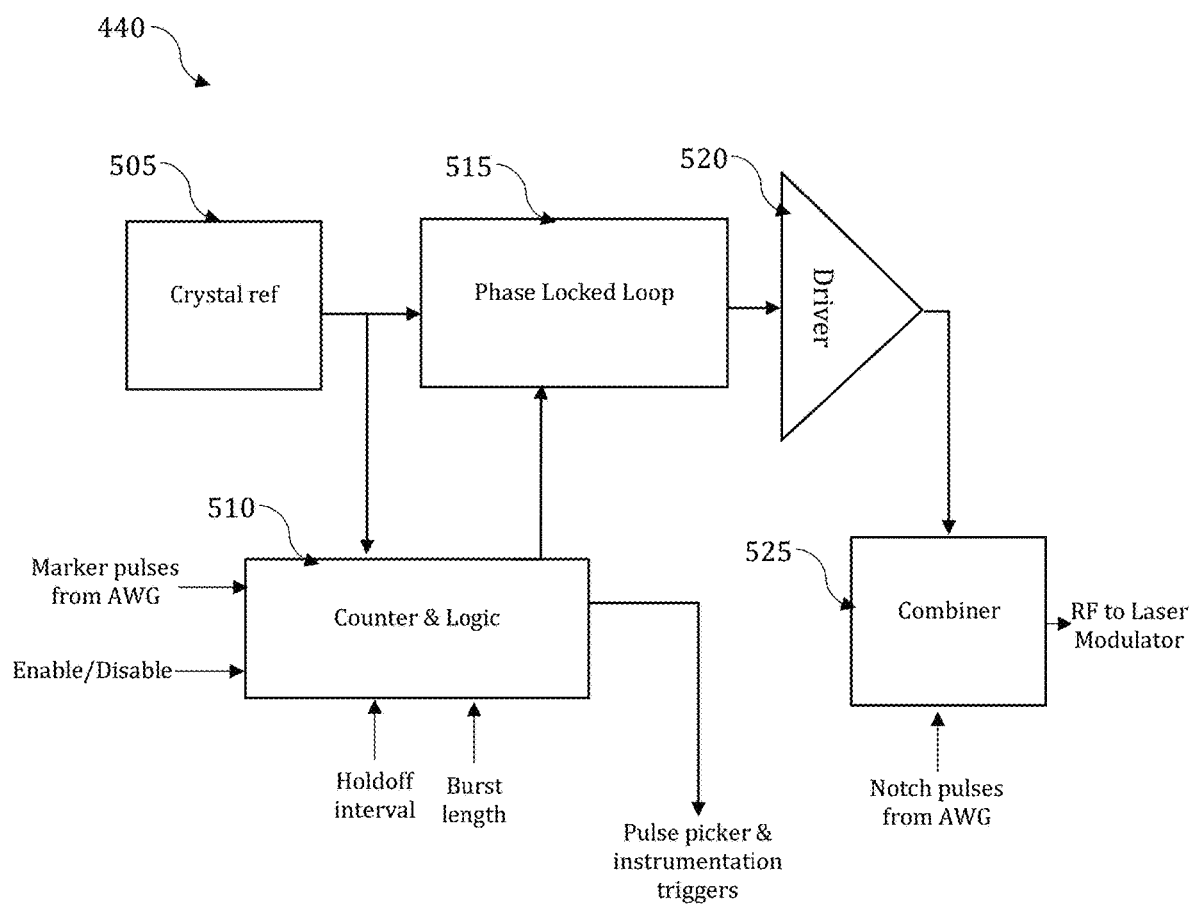
FIG. 5 depicts a block diagram of a keep-alive circuit, in accordance with disclosed embodiments.

A key aspect of the embodiments disclosed herein is the "keep-alive" electrical circuit 440. Aspects of the keep alive circuit 440 are illustrated in FIG. 5. The keep alive circuit 440 includes a crystal oscillator 505 operably connected to count-down and 1-shot circuits 510, as well as delay circuits 515 which are configured to generate "keep-alive" pulses for the CW pumped amplifier, and driver circuits 520 connected to a combiner 525 to generate triggers for pulse picking via a Pockels cell. The Pockels cell receives a trigger from the keep-alive. The Pockels cell is used to act as a "gate" to open up and let the desired laser pulses through from the CW pump section to the pulse-pumped section. In the figures this is represented by the keep-alive pulse picker output. Diagnostic triggers for the amplifier system can also be provided.

Figure 6:
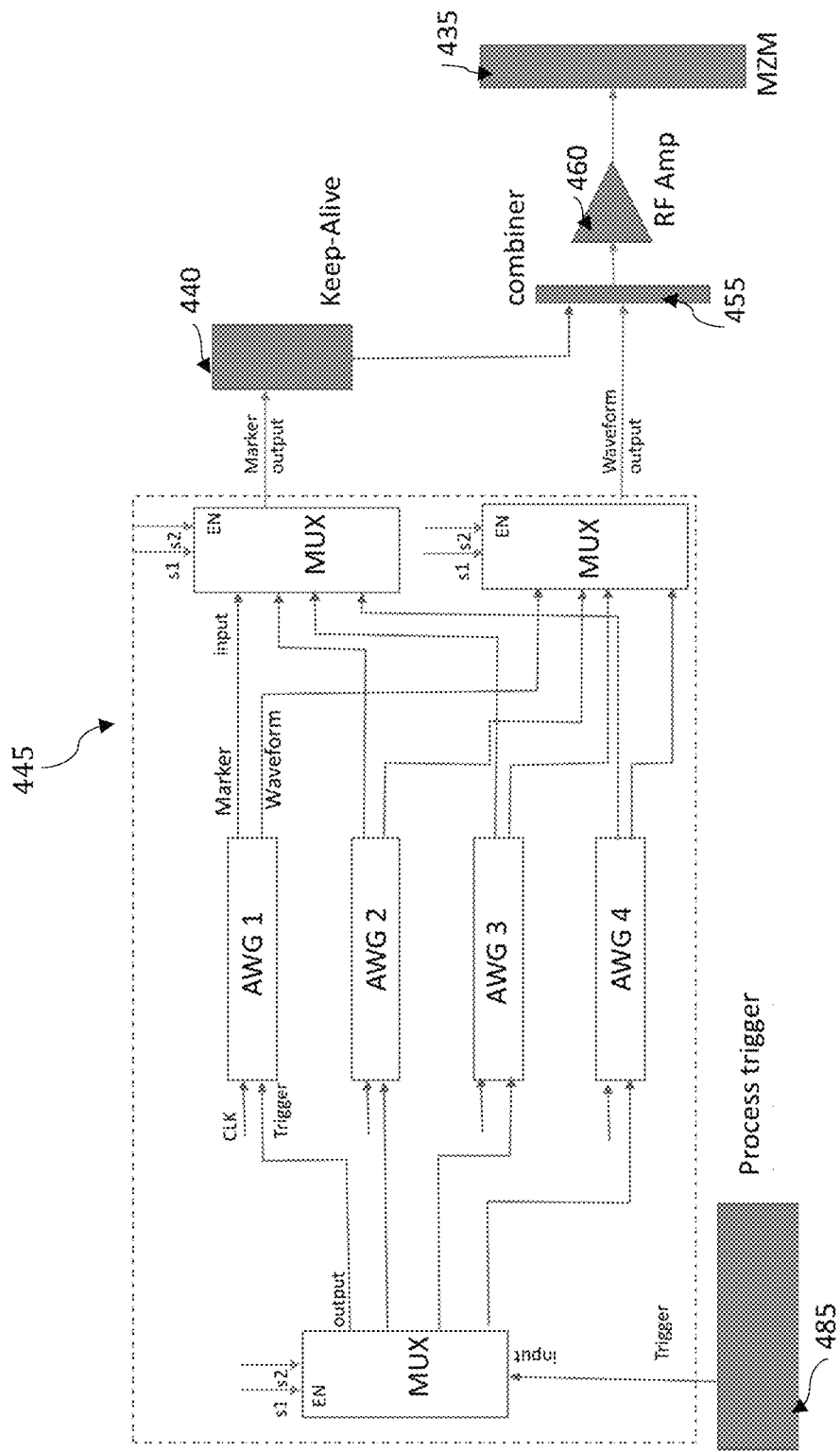
FIG. 6 depicts an expansion of the single AWG embodiment, to an embodiment with 4 AWG's, in accordance with disclosed embodiments.

FIG. 6 illustrates an expansion of the single AWG embodiment, to an embodiment with 4 AWG's. Embodiments using multiple AWG's operate in essentially the same manner as disclosed with respect to a single AWG. FIG. 6 shows a set of 4 multiplexed AWG generator modules. The area within the dashed line is functionally the same as a single AWG 445.

Each AWG module can contain a completely different, and independent, waveform. The AWG to be selected and waveform to be sent to the modulator and amplifier system is determined by a 2-bit address which routes the trigger and output via a de-multiplexer and two multiplexers.

The output of the process trigger is used to trigger one of the AWG modules illustrated in FIG. 6. The specific AWG module that is to be triggered is selected by the de-multiplexer on the left by setting the 2-bit address (i.e. s1, s2). These would be, for example, "00" for the first AWG, "01" for the second AWG, "10" for the third AWG, and "11" for the fourth AWG.

Once the address is set and a trigger from the process trigger occurs, the specific AWG, as determined by the address lines, starts to play a pre-loaded waveform table. Each of the outputs from the AWG, the marker and the waveform, are directed to different multiplexers.

The same digital address that selects the channel on the de-multiplexer also selects the same channel on both of the output multiplexers. The operation from this point is exactly similar to that of a single AWG.

To force the electrical pulse patterns from the AWG circuit 445 and KA circuit 440 to be mutually exclusive in time, the AWG 445 additionally generates a set of "marker" pulses 465 during the AWG electrical pattern which are used to "clamp" the output of the KA circuit 440 electrical pulses. Thus, only the desired waveform from the AWG 445 can be input into the MZM 435.

Each marker pulse 465 starts a count-down of a specific duration, and if another marker pulse does not renew the count-down within the specified duration, the KA oscillator output is un-clamped and resumes providing continuous seed pulses to the CW pumped amplifier system.

The output beam 433 from the MZM 435 can be subject to a second tap coupler 480. The tap coupler 480 provides a small ratio (e.g. 99:1, or other such ratio) of the beam to a modulator monitor 496. The bulk of the beam 434 can be provided as modulator output 490 to a CW pumped pre-amplifier and/or power-amplifier chain.

The arbitrary waveform generator 445 defines the temporal and amplitude structure of the laser pulses supplied by the MZM output 431. The waveform generator 445 can also generate the "marker" pulses 465, as illustrated herein, that can be used by the "keep-alive" circuit 440 to clamp its output.

It should be understood that software and/or software modules associated with computer system 100, can be used to generate a waveform including an arbitrary waveform as required in various embodiments disclosed herein. Thus, the AWG can be operably connected to a computer system 100, or other such device. The software used for the generation of the desired pulse pattern allows for control of the timing of the waveform after the trigger, the number of bursts, the number of pulses during each burst, the separation between bursts, temporal width, and amplitude of each pulse within the waveform. The software automatically includes the "marker" pulse(s) for control of the KA during the defined pulse pattern.

Figure 7:
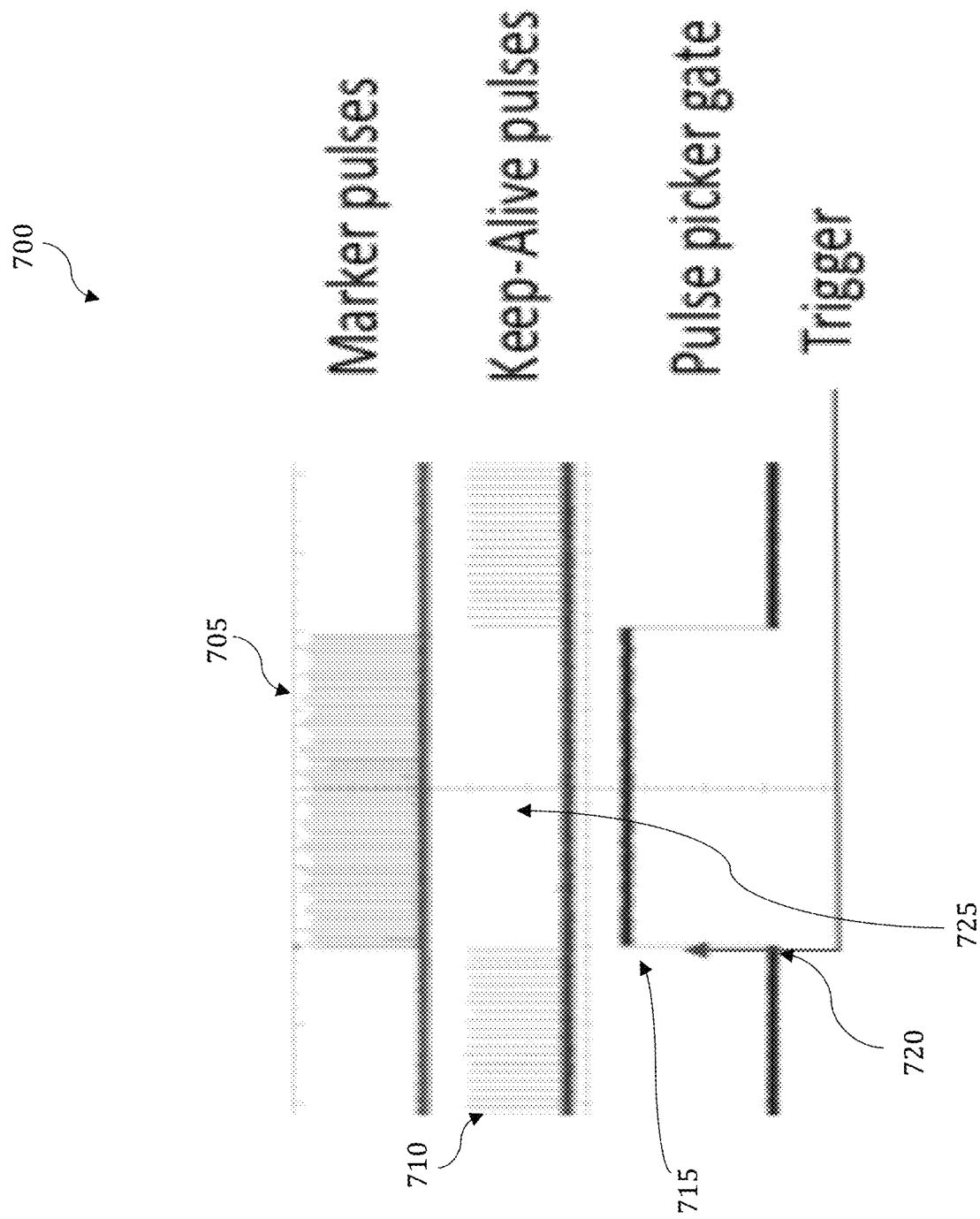
FIG. 7 depicts a timing chart, in accordance with the disclosed embodiments.

Exemplary timing of the marker pulses 705, keep-alive pulses 710, pulse picker gate 715, and trigger 720 are provided in chart 700, illustrated in FIG. 7. The region 725 following keep-alive pulses 710 contains the arbitrary pulse pattern.

Figure 8:
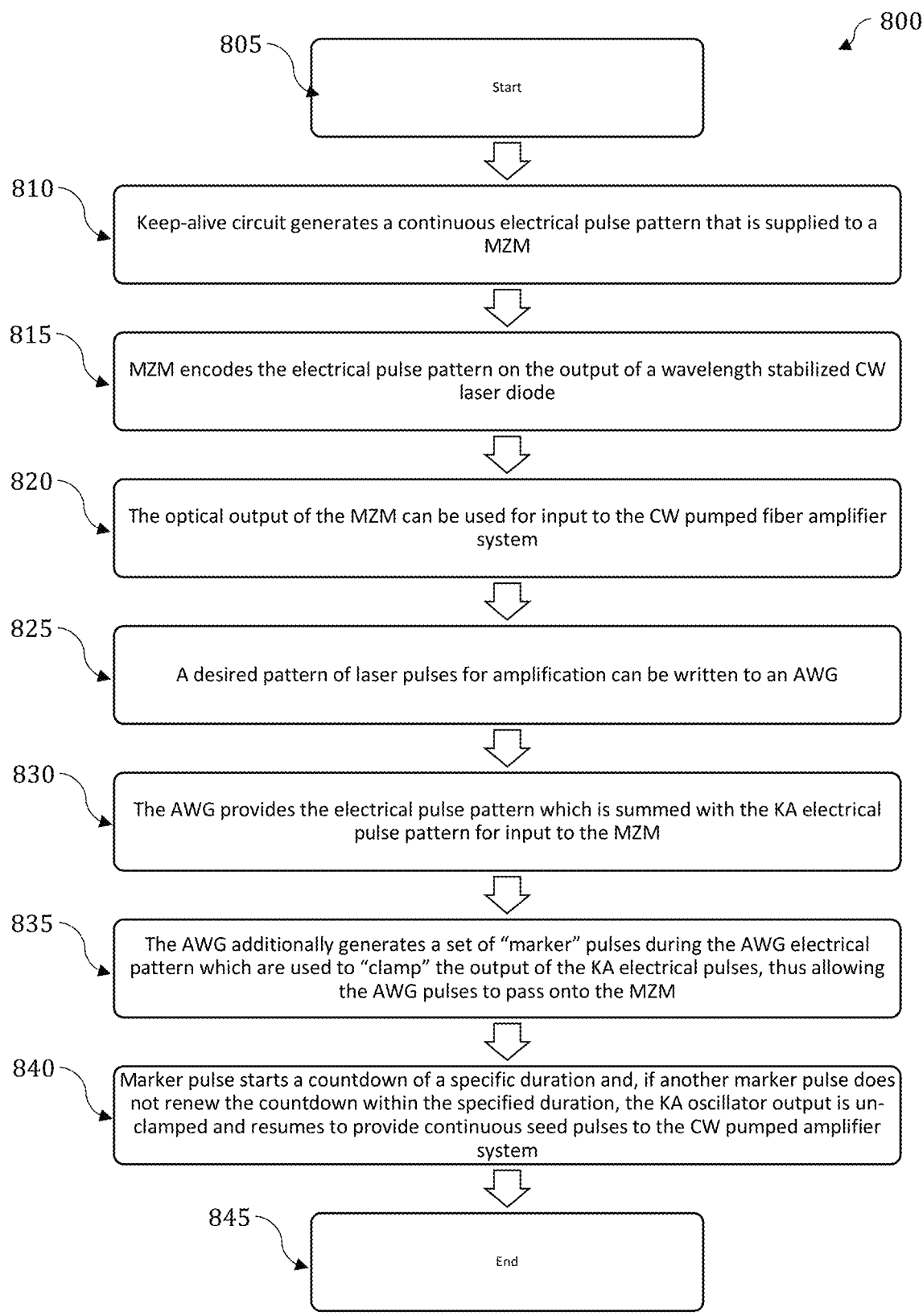
FIG. 8 depicts a flow chart of steps associated with a method for arbitrary optical pulse generation, in accordance with the disclosed embodiments.

FIG. 8 illustrates a method 800 wherein a synchronization circuit provides the ability to synchronize optical pulses to an external process by providing a synchronized trigger for the arbitrary waveform generator, in accordance with the disclosed embodiments. The method starts at 805.

In certain embodiments a crystal oscillator keep-alive (KA) circuit can generate a continuous electrical pulse pattern that is supplied to a Mach-Zehnder Optical Modulator (MZM) as shown at step 810. This MZM encodes the electrical pulse pattern on the output of a wavelength stabilized CW laser diode as shown at step 815. At step 820, the optical output of the MZM can be used for input to the CW pumped fiber amplifier system. A desired pattern of laser pulses for amplification can be written to an AWG to be triggered by an external synchronization circuit which locks the generation of the electrical pulse signal to any desired process, as shown at step 825. This locks the generation of the optical laser pulses to the process (e.g. the ion beam pulse structure).

As shown at 830 the AWG provides the electrical pulse pattern, which is summed with the KA electrical pulse pattern for input into the MZM. To force the electrical pulse patterns from the AWG and KA circuits to be mutually exclusive in time, the AWG additionally generates a set of "marker" pulses during the AWG electrical pattern which are used to "clamp" the output of the KA electrical pulses, thus allowing the AWG pulses to pass onto the MZM as shown at step 835. As such, only the desired waveform from the AWG are allowed to be input into the MZM. Each marker pulse starts a countdown of a specific duration and if another marker pulse does not renew the countdown within the specified duration, the KA oscillator output is un-clamped and resumes, to provide continuous seed pulses to the CW pumped amplifier system as shown at 840. The method ends at 845.

Based on the foregoing, it can be appreciated that a number of embodiments, preferred and alternative, are disclosed herein. For example, in an embodiment, a system comprises an optical modulator configured to impress pulse signals on an optical signal, a waveform generator configured to establish a structure of the optical signal, and a keep-alive circuit that generates a continuous electrical pulse pattern provided to the optical modulator wherein the system provides a continuous seed laser pulse structure.

In an embodiment, the system further comprises a synchronization circuit configured to synchronize the optical pulses to an external process. In an embodiment, the system further comprises a single frequency laser diode, wherein the single frequency laser diode outputs the optical signal.

In an embodiment, the system further comprises a computer system configured to implement non-transitory instruction media for controlling the waveform generator, generating a desired waveform.

In an embodiment the waveform generator further generates a marker pulse provided to the keep-alive circuit.

In an embodiment, the keep-alive circuit further comprises a crystal oscillator, a count-down and 1-shot circuit, a delay circuit configured to generate keep-alive pulses, and a driver circuit configured to generate at least one trigger. In an embodiment, the trigger comprises a process trigger that synchronizes an output the system to a process. In an embodiment, the continuous seed laser pulse structure is provided to an amplifier.

In an embodiment, a pulse generation apparatus comprises a seed laser producing an optical signal, an optical modulator configured to impress pulse signals on the optical signal, a waveform generator configured to establish a structure of the optical signal, and a keep-alive circuit that generates a continuous electrical pulse pattern provided to the optical modulator wherein the system provides a continuous seed laser pulse structure.

In an embodiment, the pulse generation apparatus further comprises a synchronization circuit configured to synchronize the optical pulses to an external process.

In an embodiment, the seed laser further comprises a laser diode and an optical isolator.

In an embodiment, the pulse generation apparatus further comprises waveform generator further generates a marker pulse provided to the keep-alive circuit.

In an embodiment, the keep-alive circuit further comprises a crystal oscillator, a count-down and 1-shot circuit, a delay circuit configured to generate keep-alive pulses, and a driver circuit configured to generate at least one trigger.

In an embodiment, the optical modulator comprises a Mach Zener Optical Modulator.

In an embodiment, the pulse generation apparatus further comprises a phase modulator and a radio frequency modulation module serves as an RF source for the phase modulator.

In an embodiment, the continuous seed laser pulse structure is provided to an amplifier.

In an embodiment, a method for pulse generation comprises producing an optical signal, imparting pulse signals on the optical signal with an optical modulator, structuring the optical signal with a waveform generator, generating a continuous electrical pulse pattern with a keep-alive circuit, the electrical pulse patter being provided to the optical modulator, and providing a continuous seed laser pulse structure.

In an embodiment, the method for pulse generation further comprises synchronizing the optical pulses to an external process with a synchronization circuit. In an embodiment, the method for pulse generation further comprises generating a marker pulse and providing the marker pulse to the keep-alive circuit. In an embodiment, the method for pulse generation further comprises providing the continuous seed laser pulse structure an amplifier.

It will be appreciated that variations of the above-disclosed and other features and functions, or alternatives thereof, may be desirably combined into many other different systems or applications. Also, it should be understood that various presently unforeseen or unanticipated alternatives, modifications, variations or improvements therein may be subsequently made by those skilled in the art which are also intended to be encompassed by the following claims.

What is claimed is:

1. A system comprising:
   an optical modulator configured to impress pulse signals on an optical signal;
   a waveform generator configured to establish a structure of said optical signal; and
   a keep-alive circuit that generates a continuous electrical pulse pattern provided to said optical modulator wherein said system provides a continuous seed laser pulse structure, wherein said keep-alive circuit further comprises:
   a crystal oscillator;
   a count-down and 1-shot circuit;
   a delay circuit configured to generate keep-alive pulses; and
   a driver circuit configured to generate at least one trigger.

2. The system of claim 1 further comprising:
   a synchronization circuit configured to synchronize said optical pulses to an external process.

3. The system of claim 1 further comprising:
   a single frequency laser diode, wherein said single frequency laser diode outputs said optical signal.

4. The system of claim 1 further comprising:
   a computer system configured to implement non-transitory instruction media for controlling said waveform generator, generating a desired waveform.

5. The system of claim 1 wherein said waveform generator further generates a marker pulse provided to said keep-alive circuit.

6. The system of claim 1 wherein said trigger comprises a process trigger that synchronizes an output of the system to a process.

7. The system of claim 1 wherein said continuous seed laser pulse structure is provided to an amplifier.

8. A pulse generation apparatus comprising:
   a seed laser producing an optical signal;
   an optical modulator configured to impress pulse signals on said optical signal;
   a waveform generator configured to establish a structure of said optical signal; and
   a keep-alive circuit that generates a continuous electrical pulse pattern provided to said optical modulator wherein said system provides a continuous seed laser pulse structure, wherein said keep-alive circuit further comprises:
   a crystal oscillator;
   a count-down and 1-shot circuit;
   a delay circuit configured to generate keep-alive pulses; and
   a driver circuit configured to generate at least one trigger.

9. The pulse generation apparatus of claim 8 further comprising:
   a synchronization circuit configured to synchronize said optical pulses to an external process.

10. The pulse generation apparatus of claim 8 wherein said seed laser further comprises:
    a laser diode; and
    an optical isolator.

11. The pulse generation apparatus of claim 8 wherein said waveform generator further generates a marker pulse provided to said keep-alive circuit.

12. The pulse generation apparatus of claim 8 wherein said optical modulator comprises a Mach Zener Optical Modulator.

13. The pulse generation apparatus of claim 8 further comprising:
    a phase modulator; and
    a radio frequency modulation module comprising an RF source for said phase modulator.

14. The pulse generation apparatus of claim 8 wherein said continuous seed laser pulse structure is provided to an amplifier.

15. A method for pulse generation comprising:
    producing an optical signal;
    imparting pulse signals on said optical signal with an optical modulator;
    structuring said optical signal with a waveform generator;
    generating a continuous electrical pulse pattern with a keep-alive circuit, said electrical pulse pattern being provided to said optical modulator, wherein said keep-alive circuit comprises:
    a crystal oscillator;
    a count-down and 1-shot circuit;
    a delay circuit configured to generate keep-alive pulses; and
    a driver circuit configured to generate at least one trigger; and
    providing a continuous seed laser pulse structure.

16. The method for pulse generation of claim 15 further comprising:
    synchronizing said optical pulses to an external process with a synchronization circuit.

17. The method for pulse generation of claim 15 further comprising:
    generating a marker pulse; and
    providing said marker pulse to said keep-alive circuit.

18. The method for pulse generation of claim 15 further comprising:
    providing said continuous seed laser pulse structure to an amplifier.

* * * * *